United States Patent
Kunze et al.

(10) Patent No.: US 11,921,131 B2
(45) Date of Patent: Mar. 5, 2024

(54) METHOD FOR MANUFACTURING A MEASUREMENT PROBE, AND MEASUREMENT PROBE

(71) Applicant: Rohde & Schwarz GmbH & Co. KG, Munich (DE)

(72) Inventors: Alexander Kunze, Munich (DE); Alexander Stuka, Hengersberg (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 17/205,661

(22) Filed: Mar. 18, 2021

(65) Prior Publication Data
US 2022/0299545 A1   Sep. 22, 2022

(51) Int. Cl.
*G01R 1/067*   (2006.01)

(52) U.S. Cl.
CPC ..... *G01R 1/06761* (2013.01); *G01R 1/06738* (2013.01)

(58) Field of Classification Search
CPC ............ G01R 1/06761; G01R 1/06738; G01R 1/06722; G01R 1/06; G01R 1/067; G01R 1/06705; G01R 1/06711; G01R 1/06716; G01R 1/06727; G01R 1/06733; G01R 1/06744; G01R 1/0675; G01R 1/06755; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392
See application file for complete search history.

(56) References Cited

U.S. PATENT DOCUMENTS

| | | | | |
|---|---|---|---|---|
| 2002/0072136 A1* | 6/2002 | Kanamaru | ......... | G01R 1/06738 438/18 |
| 2005/0140386 A1* | 6/2005 | Strid | .................. | G01R 1/06711 324/755.07 |
| 2005/0264313 A1* | 12/2005 | Aoyagi | .............. | G01R 1/06772 324/755.02 |
| 2007/0062913 A1* | 3/2007 | Mathieu | ............. | G01R 1/07314 219/69.17 |
| 2011/0121849 A1* | 5/2011 | Roland | .............. | G01R 1/06788 29/874 |
| 2015/0362551 A1* | 12/2015 | Saunders | ........... | G01R 31/2889 324/754.03 |
| 2017/0122980 A1* | 5/2017 | Crippa | .................. | H01R 43/02 |
| 2018/0045769 A1 | 2/2018 | Rettig | | |

* cited by examiner

*Primary Examiner* — Lee E Rodak
(74) *Attorney, Agent, or Firm* — Patterson + Sheridan, LLP (57) ABSTRACT

The present disclosure provides a method for manufacturing a measurement probe, the method comprising cutting a carrier substrate to form a probe contour, the probe contour comprising at least one probe tip and a probe body, and metallizing the surface of the at least one probe tip of the probe contour. Further, the present disclosure provides a respective measurement probe.

23 Claims, 9 Drawing Sheets

METHOD FOR MANUFACTURING A MEASUREMENT PROBE, AND MEASUREMENT PROBE

TECHNICAL FIELD

The disclosure relates to a method for manufacturing a measurement probe, and a respective measurement probe.

BACKGROUND

Although applicable to any type of measurement system, the present disclosure will mainly be described in conjunction with measurement devices like oscilloscopes and spectrum analyzers.

When developing and testing electronic systems it is necessary to perform a plurality of measurements. Usually devices like oscilloscopes may be used to perform such measurements. To this end, an oscilloscope has to be coupled to the device under test, also called DUT, via respective measurement probes.

Depending on the size of the DUT very small measurement probes may be required.

Accordingly, there is a need for simplifying measurements in electronic devices.

SUMMARY

The above stated problem is solved by the features of the independent claims. It is understood, that independent claims of a claim category may be formed in analogy to the dependent claims of another claim category.

Accordingly, it is provided:

A method for manufacturing a measurement probe, the method comprising cutting a carrier substrate to form a probe contour, the probe contour comprising at least one probe tip and a probe body, and metallizing the surface of the at least one probe tip of the probe contour.

Further, it is provided:

A measurement probe comprising a carrier substrate in the form of a probe contour of the measurement probe, the probe contour comprising at least one probe tip and a corresponding probe body, and a metallization layer on the surface of the at least one probe tip.

The present disclosure is based on the finding that currently available measurement probes, especially for high-frequency measurement applications, are difficult to manufacture and delicate to handle.

For example, such high-frequency measurement probes may require preparing a PCB and soldering contact pins into the prepared PCB. The manufacturing of such measurement probes is a complex process. In addition, the contact pins cannot be manufactured at small scale. For example, contact pins may have a diameter of about 1 mm or more. Mechanical structures with such large dimensions also negatively influence the electrical signals in the device under test, also called DUT, while performing a measurement.

The present disclosure provides a method for manufacturing measurement probes with improved electrical and mechanical properties, and respective measurement probes comprising such improved electrical and mechanical properties.

The method for manufacturing a measurement probe comprises cutting the probe contour from a carrier substrate. The probe contour comprises at least one probe tip and a probe body. The probe tip or multiple probe tips serve for contacting the DUT, while the probe body serves for externally contacting the measurement probe, and for example, for handling the measurement probe.

The method for manufacturing a measurement probe further comprises metallizing the surface of the at least one probe tip. The metallizing provides a metallization layer on the probe tips that allows picking up electrical signals in the DUT.

With the method according to the present disclosure, it is not required to attach external elements, like contact pins for contacting the DUT, to a base body of the measurement probe. With measurement probes that are formed of a single piece of carrier substrate and comprises one or more metallized probe tips, it is, therefore, possible to manufacture measurement probes at very small scale. Such measurement probes when applied to a DUT create only very small parasitic impedances as compared to traditional measurement probes.

With measurement probes according to the present disclosure it is consequently possible to easily measure high speed signals in the range of multiple tens of GHz, like e.g. up to 30 GHz or more. The measurement probes according to the present disclosure may therefore for example be used to measure high-speed signals, like PCI Express signals.

In addition, the manufacturing process is simplified as compared to measurement probes that require inserting additional pins or the like into a probe body, since only a single carrier substrate is to be treated accordingly. A measurement probe manufactured of a single carrier substrate also offers a high mechanical stability.

It is understood, that a measurement probe according to the present disclosure may be a single-ended measurement probe comprising only a single probe tip or a double-ended measurement probe comprising two probe tips. It is also possible to provide a measurement probe with more than two probe tips.

In case of a two-ended probe, a mechanical arrangement may be provided that allows adjusting the distance between the single probe tips.

Further embodiments of the present disclosure are subject of the further dependent claims and of the following description, referring to the drawings.

In an embodiment, the method may comprise forming the at least one probe tip by cutting the carrier substrate to provide a respective protrusion at least in a predefined plane, especially the plane of extension of the carrier substrate.

Usually the carrier substrate will be a planar substrate that extends in a respective plane. Two-dimensional shapes may, therefore, easily be cut from the carrier substrate by projecting the shape on the carrier substrate in the plane of extension of the carrier substrate.

The protrusion that forms the probe tips may be formed as a protrusion in at least a predefined plane. This allows providing the shapes of the probe tips as a two-dimensional contour that is then manufactured into the carrier substrate.

It is understood, that alternatively the shapes of the protrusions may also be provided as a three-dimensional shape.

In another embodiment, forming the at least one probe tip may comprise laser cutting and/or milling the outer circumference of the protrusion, especially to provide a two-dimensional shape of the at least one probe tip.

It is understood, that the term "two-dimensional shape" in this regard refers to the shape being cut in a plane comprising two-dimensions. It is understood, that the measurement probe, and especially the at least one probe tip, will comprise a three-dimensional structure at least because the carrier substrate will be of a predetermined thickness. The shapes of the measurement probe, and especially the at least one probe tip, will therefore in the plane of the carrier substrate comprise the outer circumference as provided for cutting or milling, but will be as thick as the carrier substrate in a plane orthogonal to the plane of the carrier substrate.

If the at least one probe tip is provided with a two-dimensional shape, the at least one probe tip may be formed by simply laser cutting or milling the two-dimensional shape of the at least one probe tip in the plane of extension of the carrier substrate.

A two-dimensional shape is very simple to manufacture with a laser cutter or a milling machine.

In yet another embodiment, forming the at least one probe tip may comprise laser cutting and/or milling a three-dimensional shape of the respective protrusion, especially to provide a three-dimensional shape of the at least one probe tip.

A three-dimensionally shaped probe tip may be provided e.g., by repeatedly running a laser cutter or mil over the carrier substrate and at the respective spots only removing slices of a predetermined height from the carrier substrate with each pass. It is therefore possible to shape the protrusions like e.g. spikes or half-spheres, if only one side of the carrier substrate is treated, or as spheres or the like, if both sides of the carrier substrate are treated.

Providing not only a two-dimensional shape but also forming the height of the at least one probe tip according to a predetermined shape, allows freely adapting the probe tip to the measurement task and creating a respective three-dimensional shape.

In a further embodiment, the carrier substrate may comprise a printed circuit board carrier substrate, especially a single-layer or multi-layer metallized printed circuit board carrier substrate.

The carrier substrate may be any type of printed circuit board carrier substrate like e.g. epoxy laminate, like FR-1, FR-2, FR-3, FR-4, CEM-1, CEM-2, CEM-3, CEM-4, or CEM-5 laminate, polyimide laminate, Teflon laminate, flexible laminate, or any other adequate type of material.

Using a material that is common in printed circuit board manufacturing allows using all production processes that may be used for printed circuit boards also for manufacturing the measurement probe according to the present disclosure.

In an embodiment, metallizing may comprise metallizing the surface of the at least one probe tip with a metallization layer comprising a nickel palladium gold alloy, especially an electroless nickel electroless palladium immersion gold alloy.

Nickel Palladium Gold alloy is very hard and robust and at the same time has a high electrical conductivity. Coating the at least one probe tip with such a type of alloy therefore provides additional rigidity to the at least one probe tip while ensuring good signal conductivity for the signals to be measured.

It is understood, that in the case of a PCB carrier substrate being used as the carrier substrate for the measurement probe, a copper layer or any other conductive layer may be present on the carrier substrate and therefore below the metallization layer.

In a further embodiment, metallizing may comprise coating the surface of the at least one probe tip with a metallization layer comprising a thickness of 10 µm to 50 µm, especially 15 µm to 30 µm, or especially 15 µm to 20 µm.

Providing a thickness of the metallization layer of about 10 µm to 50 µm adds rigidity and mechanical stability to the at least one probe tip. The at least one probe tip is, therefore, protected against abrasion and wear without excessively increasing the overall dimensions of the at least one probe tip.

As explained above, a conductive layer may be present on the carrier substrate prior to metallizing the at least one probe tip. Such a layer will usually comprise a thickness of about 20 µm-40 µm. The total thickness of the conductive layer with the metallization layer may therefore range between 25 µm and 90 µm.

In yet another embodiment, the method may further comprise providing an electrical connection on the probe body to the at least one probe tip. The electrical connection may directly or indirectly be coupled to the metallization layer of the probe tip.

The electrical connection on the probe body to the at least one probe tip allows adding additional electrical elements to the measurement probe on the probe body, which may provide more space than the at least one probe tip, further elements like e.g., connectors, that may be electrically coupled to the at least one probe tip. It is understood, that a dedicated electrical connection may be provided for each probe tip.

Since the probe body does not need to fit any small scale structures on a DUT, the probe body may be larger than the at least one probe tip, and the shape of the probe body may be freely chosen.

In another embodiment, the electrical connection may comprise a microstrip line or a coplanar line with a predetermined impedance, especially with an impedance of 50 Ohms.

If signals to be measured are to be transferred via the measurement probe to a measurement device like e.g., an oscilloscope, the signal path should be provided with a known impedance and should comprise as little impedance changes as possible. Providing the electrical connection with a predetermined impedance allows configuring the measurement probe according to the measurement equipment that will be used with the measurement probe.

An impedance of 50 Ohms allows using the measurement probe with a wide variety of cables and connectors that are usually used in measurement applications and comprise an impedance of 50 Ohms.

In an embodiment, the method may comprise providing an electrical connector for at least one probe tip on the probe body and electrically coupling the electrical connector to the respective electrical connection, and via the electrical connection to the respective prove tip.

As explained above, the probe body may provide more space for mounting additional elements on the measurement probe, and the electrical connection may be used to electrically couple such elements with the at least one probe tip.

The connector may be used to electrically couple the measurement probe to a cable. Especially for the measurement of high frequency signals, coaxial cables may be used. The connector may in an embodiment be any type of connector that may be used to couple to coaxial cables. It is understood, that in other embodiments, other types of connectors may be used.

On the carrier substrate respective contact pads or contact zones and possibly recesses or holes may be provided that allow mounting and contacting the electrical connector.

It is understood, that the electrical connection may comprise a signal line and ground lines or ground planes, or that in addition to the electrical connection a ground connection or ground plane(s) may be provided.

Especially, if the carrier substrate is a multi-layer PCB substrate, one or more ground planes may be provided that may be connected to a shield or ground contact of the electrical connector.

In an embodiment, the electrical connection may be provided on the top surface of the carrier substrate, and a ground plane may be provided on a layer under the top surface. Ground section may also be provided besides or alongside the electrical connection. In another embodiment, the electrical connection may be provided on a buried layer of the carrier substrate i.e., between the top and bottom layer. A ground plane may in such an embodiment be provided on the top surface of the carrier substrate and the bottom surface of the carrier substrate or any combination of layers that are above and below the layer comprising the electrical connection.

In a further embodiment, the method may comprise providing a resistor in the electrical connection of at least one probe tip with a predetermined resistance value. The resistance value may in an embodiment be between 50 kOhms and 500 kOhms, more especially a value between 100 kOhms and 200 kOhms.

The signal line in the DUT should not be loaded with high loads i.e., low resistances. To reduce the load on the signal lines of the DUT, and therefore reduce the influence of the measurement on the signal quality in the DUT, the resistor may be provided with a resistance that is higher than 50 kOhms.

If a probe tip with such a resistor is attached or coupled to a DUT, the signal lines in the DUT experience the additional load provided by the measurement probe. With the resistor this load will be limited to an acceptable value.

In yet another embodiment, the resistor may be provided as a surface-mounted device, also called SMD resistor. This allows choosing the resistor from a wide variety of possible resistors that are widely available. Further, a SMD resistor may easily be mounted with PCB manufacturing methods.

In an embodiment, the resistor may be provided at a distance of 0.1 mm to 1.5 mm from a contacting end or edge of the respective probe tip.

The length of the signal path from the point where a probe tip touches the DUT i.e., the contacting end or edge, to the resistance should be minimized. Therefore, depending on the size of the resistance and the mechanical manufacturing tolerances, the resistance may be placed at about 0.1 mm to 1.5 mm from the contacting end of the probe tip.

In an embodiment, the resistor may be provided as a printed resistor, especially a polymer thick film printed resistor.

A printed resistor is a special type of resistor that may be printed onto the carrier substrate with a special ink or paste that provides the required resistance.

In addition, a printed resistor may be trimmed regarding size and resistance value e.g., by laser edging or cutting. Therefore, a printed resistor may be placed nearer to the contacting end or edge of the probe tip than a discrete element, like a SMD resistor.

In an embodiment with a printed resistor, the printed resistor may be printed to extend to the edge or circumference of a probe tip before or after the metallization layer is provided on the probe tip. After printing, the resistor may be trimmed e.g., by laser cutting or laser edging, to comprise the size and resistance value that is required.

Further, the resistor may be printed over the metallization layer and the exact contour of the resistor may be formed by laser trimming. As alternative, the resistor may be printed and trimmer before applying the metallization layer, and the shape of the metallization layer may be formed by a respective trimming process. In such an embodiment, the printed resistor may also completely cover the probe tip.

BRIEF DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which.

In the figures like reference signs denote like elements unless stated otherwise.

DETAILED DESCRIPTION OF THE DRAWINGS

Figure 1:
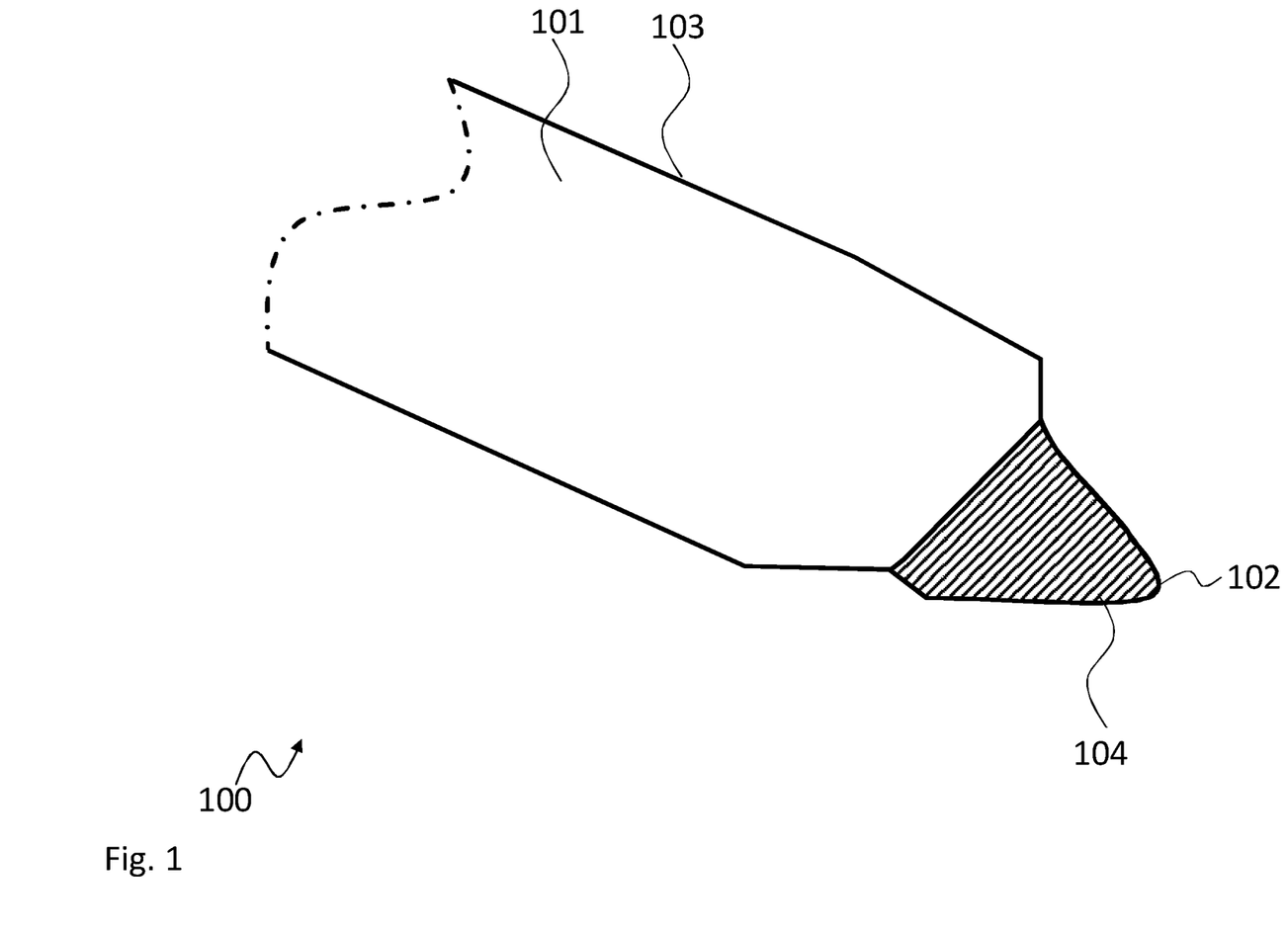
FIG. 1 shows a schematic diagram of an embodiment of a measurement probe according to the present disclosure.

FIG. 1 shows a schematic diagram of a measurement probe 100. The measurement probe 100 comprises a carrier substrate 101 that is cut to comprise the desired probe contour of the measurement probe 100. On the carrier substrate 101 a probe tip 102 and a probe body 103 are formed as different sections or zones on the carrier substrate 101. In addition, the probe tip 102 comprises a metallization layer 104 that completely covers the probe tip 102.

The probe tip 102 of the measurement probe 100 may in an exemplary embodiment be formed by laser cutting or milling the probe contour on a planar carrier substrate 101. It is understood, that the cutting or milling may be performed in multiple steps. For example, in a first step specific details of the probe contour like e.g., the probe tip 102, may be formed. Then the metallization layer 104 may be provided and finally, the remaining parts of the probe contour may be formed. This manufacturing process allows handling the carrier substrate 101 easily while forming specific details like the probe tip 102, and then trimming the carrier substrate 101 into the final probe contour when most of the manufacturing is finished and no delicate handling processes need to be performed any more.

The carrier substrate 101 may in embodiments comprise a printed circuit board carrier substrate. It is understood, that especially a single-layer PCB material or multi-layer PCB material may be used.

The metallization layer 104 may in embodiments comprise a nickel palladium gold alloy. An alloy used in PCB manufacturing is electroless nickel electroless palladium immersion gold alloy, which may be used to provide the metallization layer 104. Depending on the intended application of the measurement probe 100, the metallization layer 104 may be dimensioned accordingly and may comprise a thickness of 10 μm to 50 μm. If the carrier substrate 101 is covered at least on one surface with copper, as may be the case for single-layer or multi-layer PCB material, the metallization layer 104 may be provided on the copper or the copper may be removed by a respective manufacturing process before applying the metallization layer.

The metallization layer 104 serves for contacting the DUT and picking up signals in the DUT that are to be measured. At the same time, with an adequate material like the above-mentioned alloy, the metallization layer 104 also provides mechanical stability to the probe tip.

Figure 2:
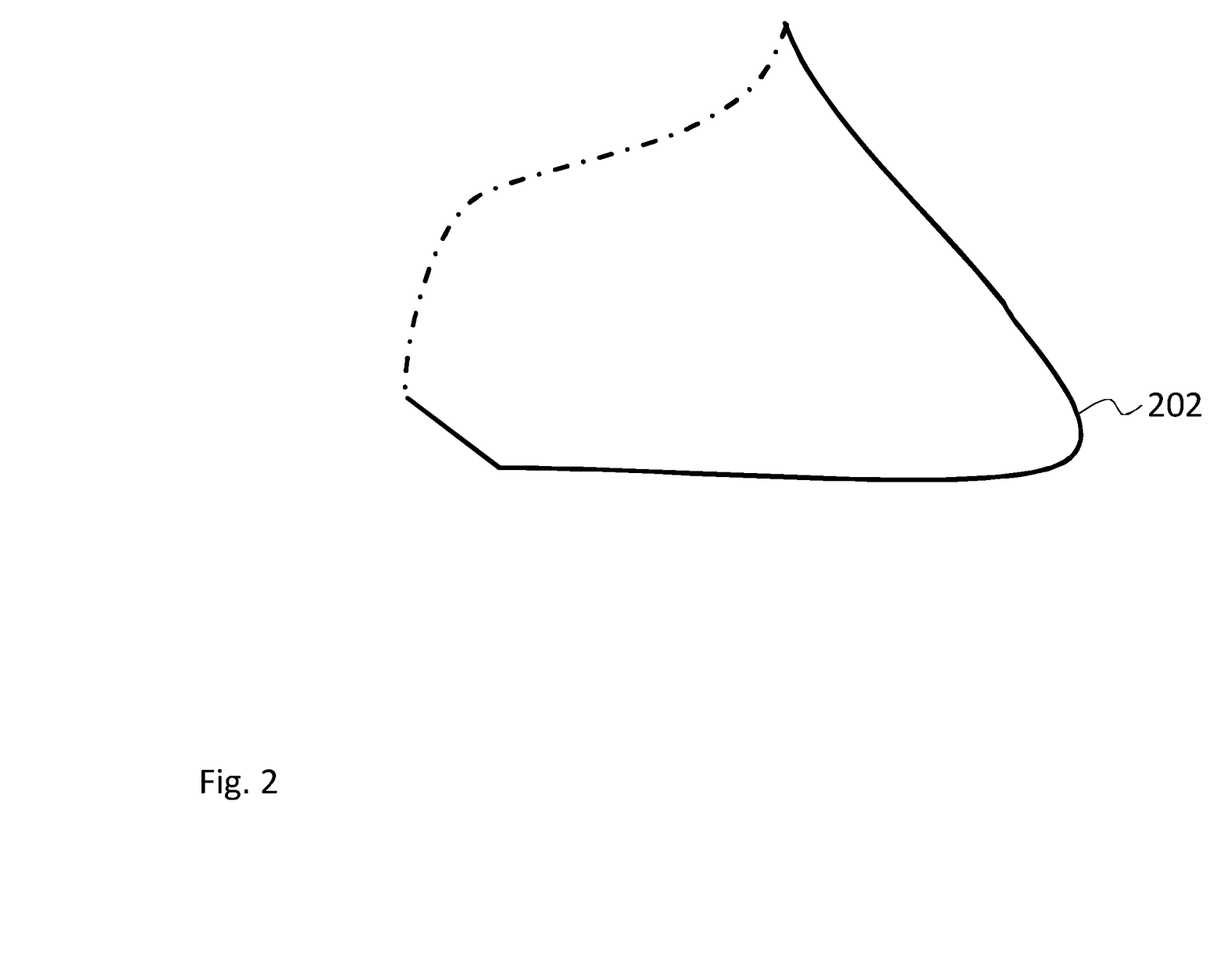
FIG. 2 shows a schematic diagram of an embodiment of a probe tip according to the present disclosure in a top view.

FIG. 2 shows a schematic diagram a probe tip 202 in a top view. The probe tip 202 has the same contour as the probe tip 102 and is a two-dimensional probe tip 202.

Two-dimensional probe tips like the probe tip 202 may be formed easily with simple 2D cutting or milling processes that cut the contour of the respective probe tip 202 into the carrier substrate.

Figure 3:
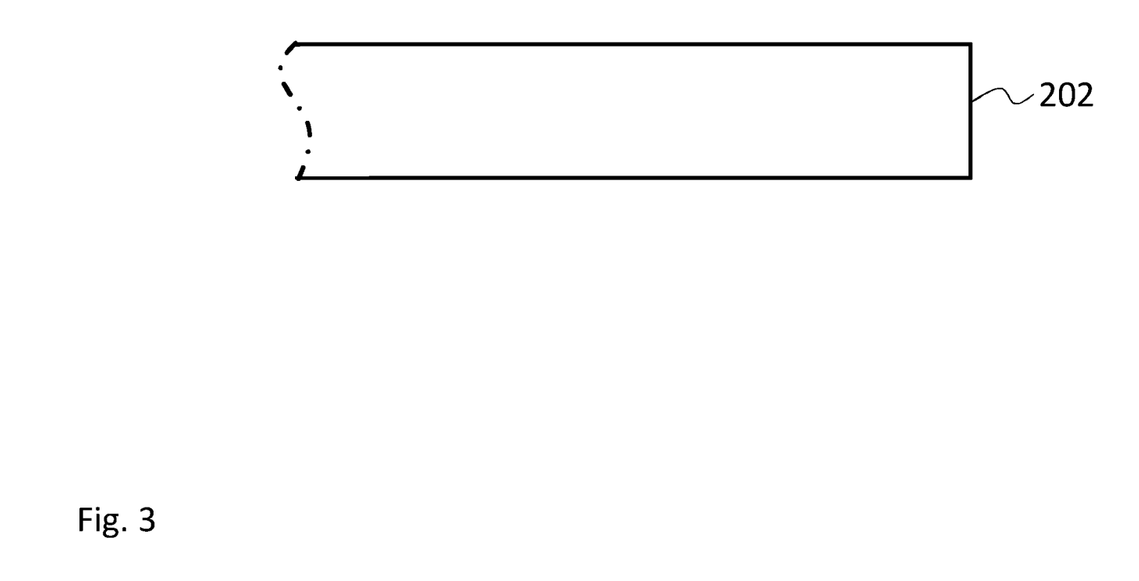
FIG. 3 shows a schematic diagram of the probe tip of FIG. 2 in a side view.

FIG. 3 shows the probe tip of FIG. 2 in a side view. It can be seen, that the probe tip 202 in the side view has an even thickness or a constant height.

Figure 4:
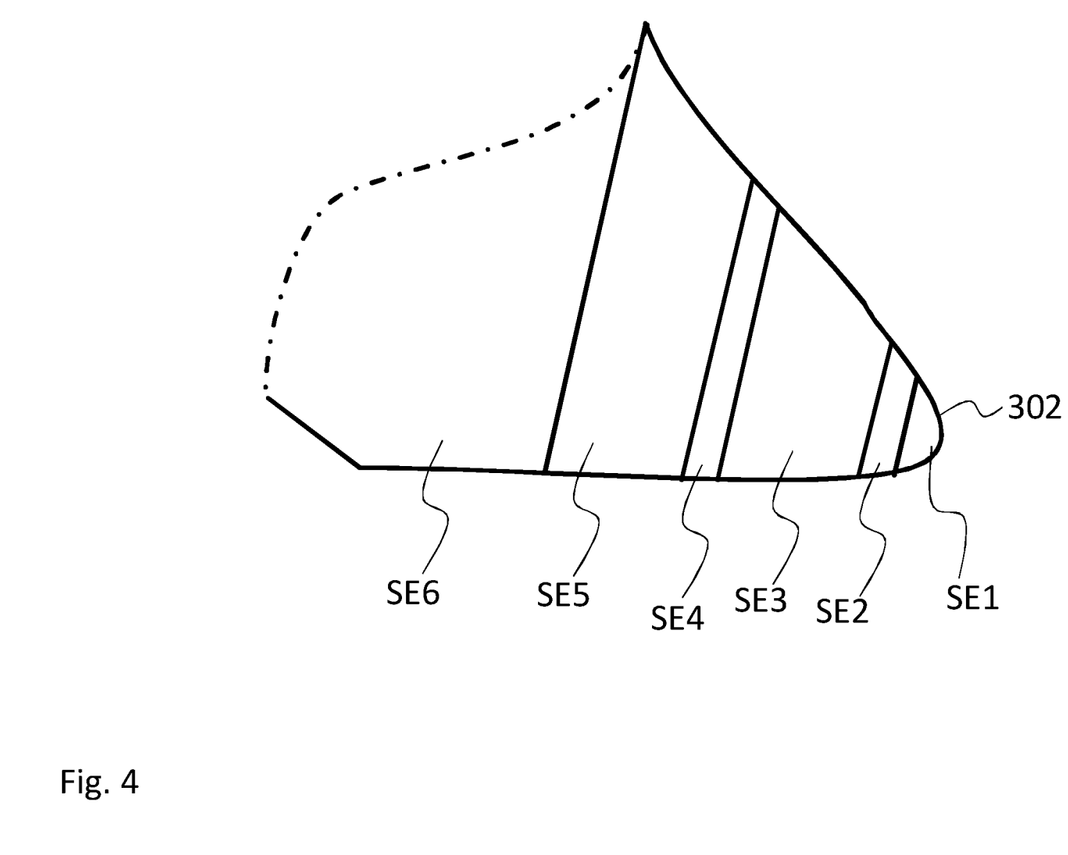
FIG. 4 shows a schematic diagram of another embodiment of a probe tip according to the present disclosure in top view.

FIG. 4 shows a schematic diagram of another embodiment of a probe tip 302 in a top view. The probe tip 302 comprises sections SE1-SE6 of different heights.

Section SE1 on the pointed end of the probe tip 302 has a first height, which is about half of the thickness of the carrier substrate used to form probe tip 302. Section SE2 has a thickness of about % of the thickness of the carrier substrate, and Section SE3 has the full thickness of the carrier substrate. The sections S1-S3 form a kind of upward slope at the pointed end of the probe tip 302.

Sections SE3, SE4 and SE5 represent the inverse pattern and form a downward slope. Section SE6 has the same height as the carrier substrate and serves to couple the probe tip 302 to a respective probe body.

It is understood, that similar structures may be provided on the bottom surface of the carrier substrate 301.

Figure 5:
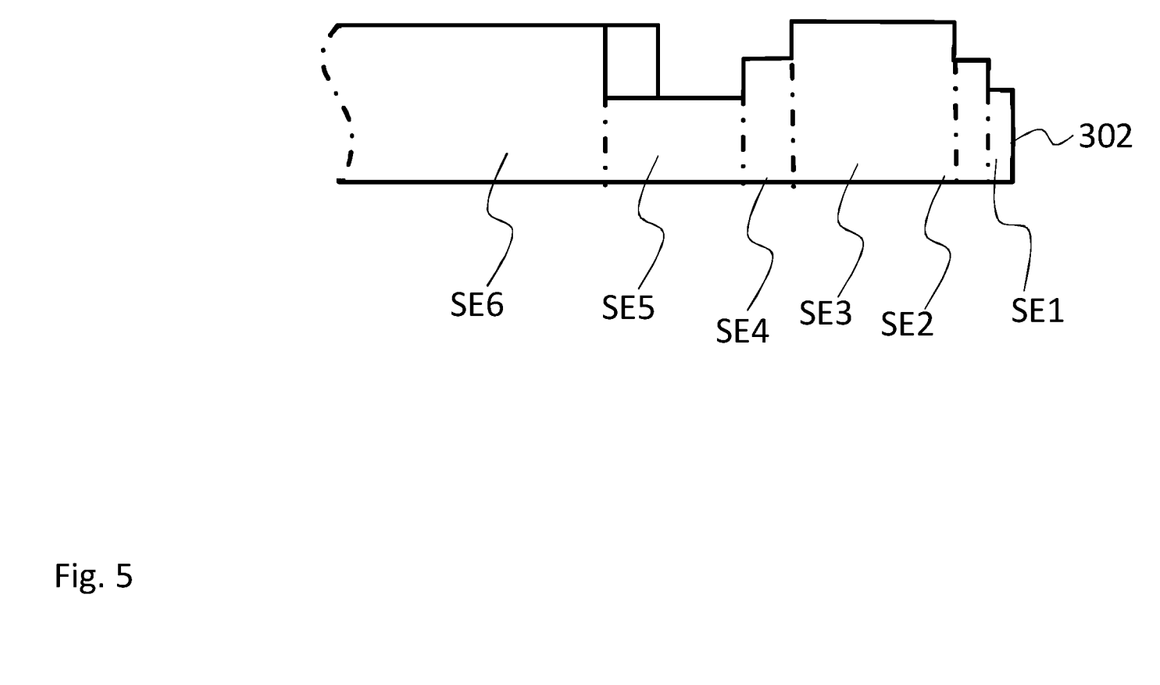
FIG. 5 shows a schematic diagram of the probe tip of FIG. 4 in side view.

FIG. 5 shows probe tip 302 in a side view. In the side view it is obvious, that the sections SE1-SE5 on the pointed end of the probe tip 302 form a kind of ball-end for contacting the DUT.

It is understood, that the shown height profile is just exemplarily shown. In other embodiments, more or less steps may be used. In further embodiments, instead of orthogonal surfaces inclined surfaces may be formed e.g., by 3D-milling or the like.

Figure 6:
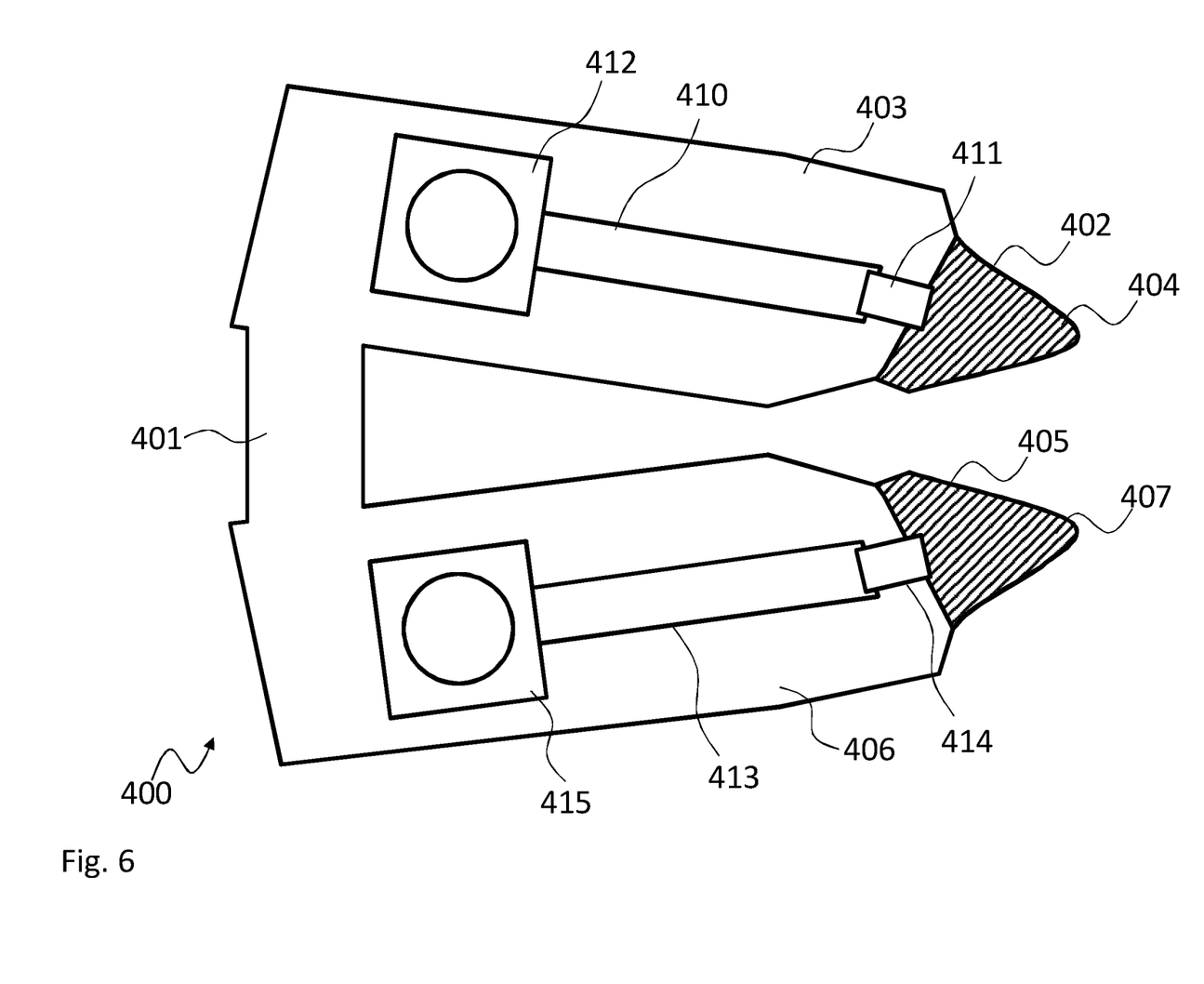
FIG. 6 shows a schematic diagram of another embodiment of a measurement probe according to the present disclosure.

FIG. 6 shows a schematic diagram of another measurement probe 400. The measurement probe 400 is based on the measurement probe 100. Therefore, the measurement probe 400 comprises a carrier substrate 401 as basis for forming probe bodies 403, 406, and probe tips 402, 405. It is understood, that the measurement probe 400 only exemplarily comprises two probe bodies 403, 406 with respective probe tips 402, 405. A measurement probe 400 with only one probe body and one probe tip is also possible. In other embodiments, a measurement probe 400 with more than two probe tips e.g., for measurement of a plurality of parallel signals, is also possible.

Both probe tips 402, 405 and probe bodies 403, 406 are identical but mirrored on the horizontal axis and coupled to each other by carrier substrate 401 on the end facing away from the probe tips 402, 405, forming a tweezer-like arrangement for the measurement probe 400. It is understood, that instead of uniting two or more probe bodies via a fixed piece of carrier substrate, separate measurement probes may be coupled to each other via a respective mechanical element, like for example a bracket or the like. Such an element may comprise a metallic or conductive material and the counterparts for the element on the measurement probes may be conductive or metallic and be coupled with a ground network of the respective measurement probe.

The probe tips 402, 405 are formed according to probe tip 102 and comprise a metallization layer 404, 405. On each of the probe bodies 403, 406 a respective electrical connection 410, 413 and a respective electrical connector 412, 415 is provided.

The electrical connections 410, 413 may be provided as microstrip lines with a predetermined impedance, like for example 50 Ohms. On one end the electrical connections 410, 413 couple to the respective electrical connector 412, 415. In the measurement probe 400 the electrical connectors 412, 415 are provided as RF-connectors, like for example Mini-SMP connectors. It is understood, that other connectors are possible The electrical connections 410, 413 couple the respective electrical connector 412, 415 with the respective probe tip 402, 405. However, the electrical connections 410, 413 are not directly coupled to the respective probe tip 402, 405. Instead, a SMD resistor is provided between each of the electrical connections 410, 413 and the metallization layer 404, 405 of the respective probe tip 402, 405. The resistors may comprise a resistance value of about 50 kOhms to 500 kOhms, typically a resistance value between 100 kOhms and 200 kOhms may be used.

Although not shown, it is understood, that additional ground planes or ground zones may be provided on the probe bodies 403, 406 that may couple to a shield or ground contact of the respective electrical connector 412, 415.

Figure 7:
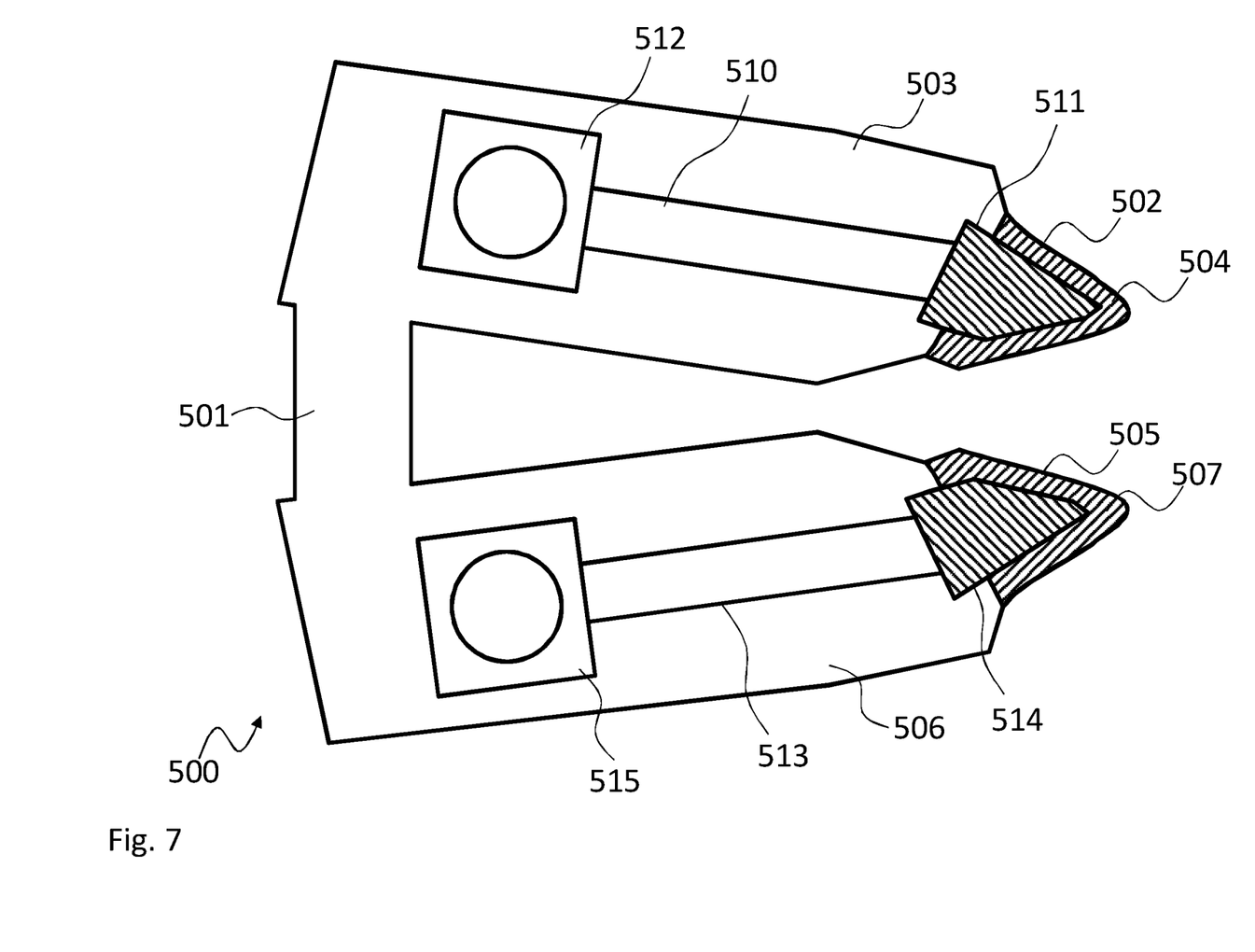
FIG. 7 shows a schematic diagram of another embodiment of a measurement probe according to the present disclosure.

FIG. 7 shows a schematic diagram of another possible measurement probe 500. The measurement probe 500 is based on the measurement probe 400. Therefore, the measurement probe 500 comprises a carrier substrate 501 as basis for forming probe bodies 503, 506, and probe tips 502, 505. It is understood, that the measurement probe 500 only exemplarily comprises two probe bodies 503, 506 with respective probe tips 502, 505. A measurement probe 500 with only one probe body and one probe tip is also possible. In other embodiments, a measurement probe 500 with more than two probe tips e.g., for measurement of a plurality of parallel signals, is also possible.

The probe tips 502, 505 are formed according to the probe tips 402, 405 and each comprise a metallization layer 504, 507. On each of the probe bodies 503, 506 a respective electrical connection 510, 513 and a respective electrical connector 512, 515 are provided.

The explanations regarding the measurement probe 400 apply to the measurement probe 500 mutatis mutandis.

In contrast to the SMD resistors of measurement probe 400, the measurement probe 500 comprises two printed resistors 511, 514 that couple the metallization layers 504, 507 to the respective one of the electrical connections 510, 513.

Printed resistors 511, 514 may easily be modelled according to the shape of the probe tips 502, 505. The distance between the outer edge of a probe tip 502, 505 and the printed resistor 511, 514 may therefore be reduced to a minimum. This arrangement consequently further reduces the negative influence of the measurement on the signal quality in the DUT.

The printed resistors 511, 514 may be formed as thick film resistors with a respective paste that may be printed onto the carrier substrate 501. Exact trimming of the resistance values may then be performed e.g., by laser trimming the printed resistors 511, 514.

Figure 8:
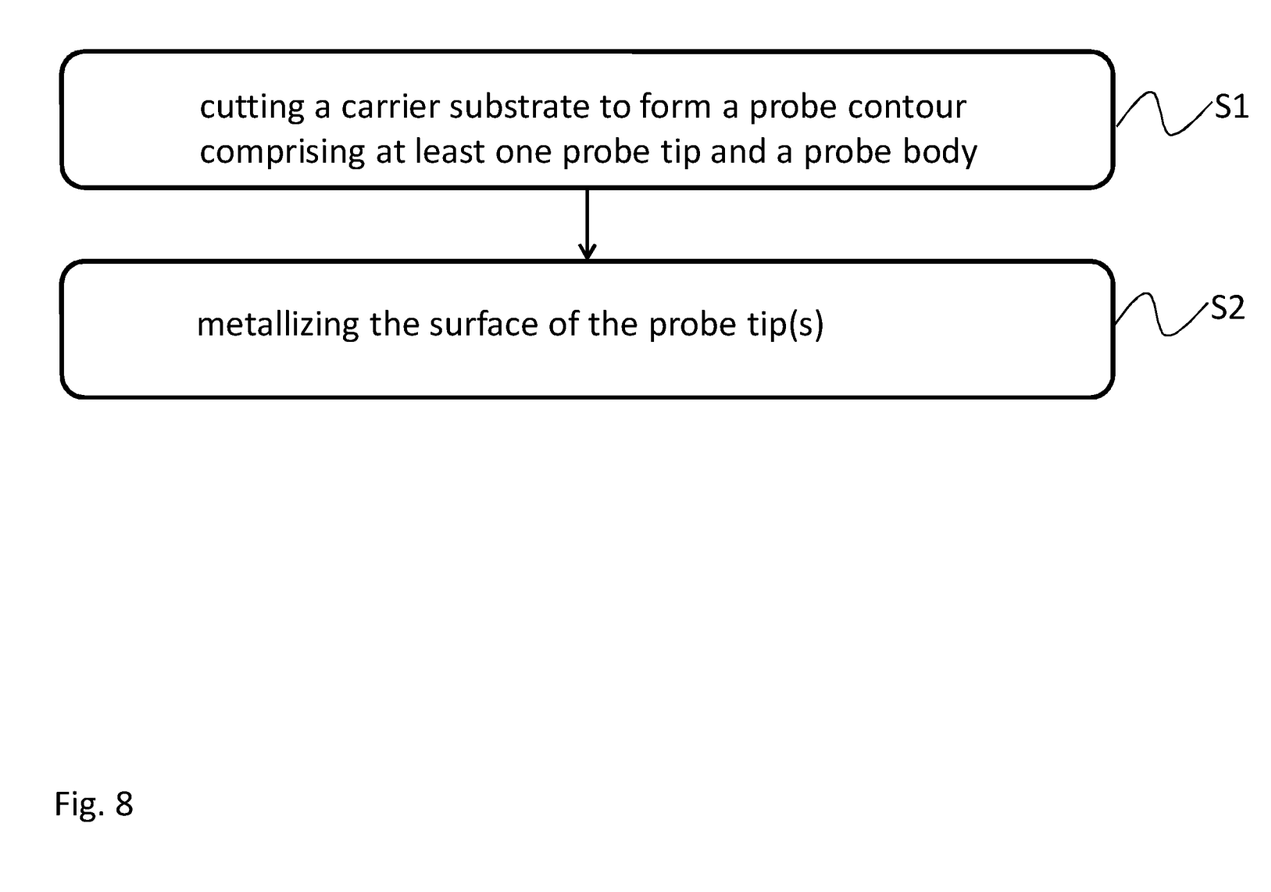
FIG. 8 shows a flow diagram of an embodiment of a method according to the present disclosure.

FIG. 8 shows a flow diagram of a method for manufacturing a measurement probe.

The method comprises cutting S1 a carrier substrate to form a probe contour. As explained above, the probe contour comprises at least one probe tip with a respective probe body. The method further comprises metallizing S2 the surface of the at least one probe tip of the probe contour.

The carrier substrate may comprise a printed circuit board carrier substrate, like for example a single-layer or multi-layer metallized printed circuit board carrier substrate.

Cutting S1 may comprise forming the at least one probe tip by cutting the carrier substrate to provide a respective protrusion at least in a predefined plane, for example in the plane of extension of the carrier substrate. The forming of the at least one probe tip may be performed by laser cutting and/or milling the outer circumference of the protrusion to form a two-dimensional shape or contour. Alternatively, forming the at least one probe tip may comprise laser cutting and/or milling a three-dimensional shape of the respective protrusion to form a three-dimensional shape of the probe contour.

Metallizing S2 may comprise metallizing the surface of the at least one probe tip with a metallization layer comprising a nickel palladium gold alloy. A respective alloy may be an electroless nickel electroless palladium immersion gold alloy.

The process of metallizing may provide the surface of the at least one probe tip with a metallization layer comprising a thickness of 10 μm to 50 μm, especially 15 μm to 30 μm, or especially 15 μm to 20 μm.

Figure 9:
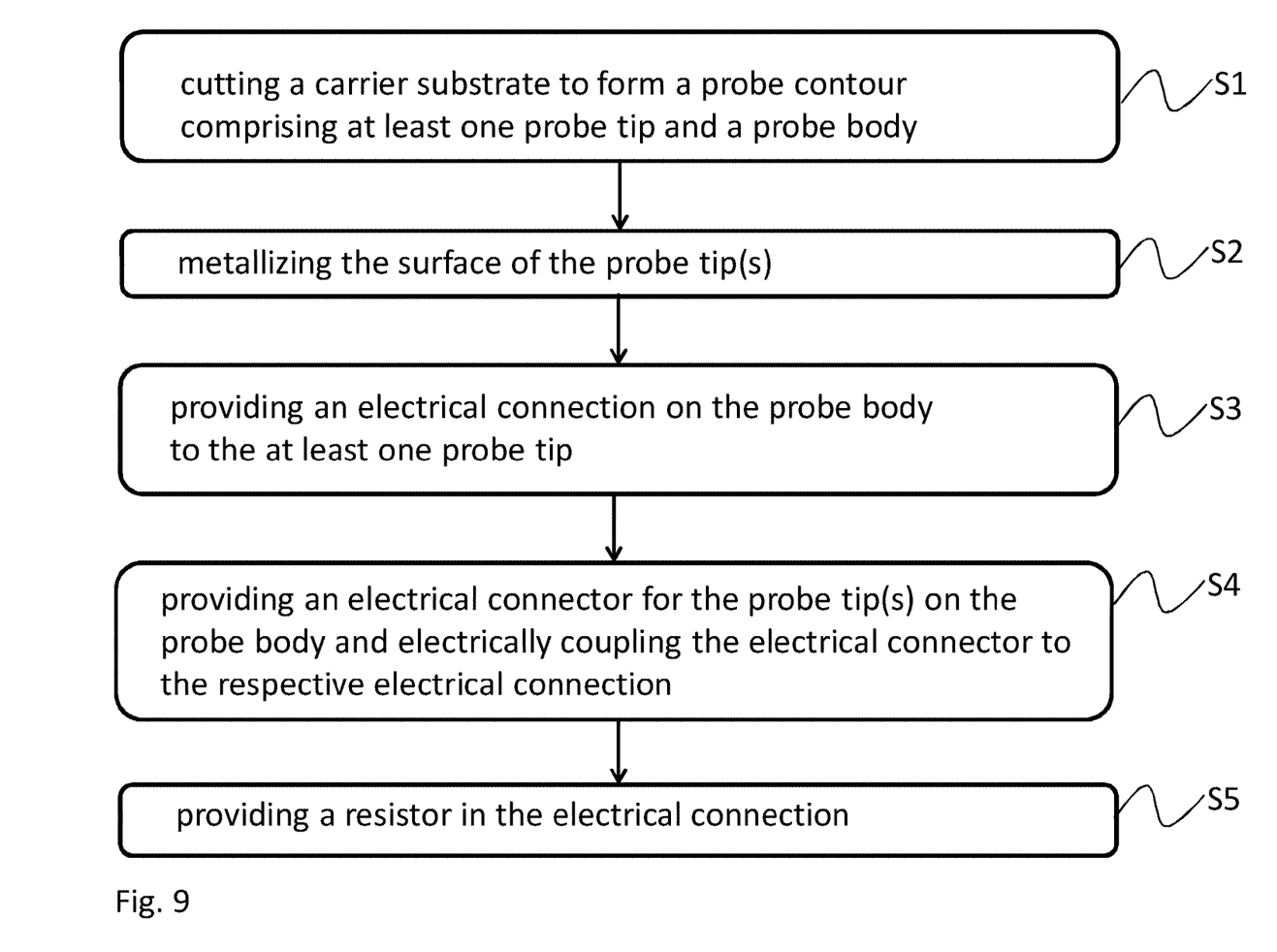
FIG. 9 shows a flow diagram of an embodiment of another method according to the present disclosure.

FIG. 9 shows a flow diagram of another method for manufacturing a measurement probe. The method of FIG. 9 is based on the method of FIG. 8 and comprises cutting S1 a carrier substrate to form a probe contour. As explained above, the probe contour comprises at least one probe tip with a respective probe body. The method further comprises metallizing S2 the surface of the at least one probe tip of the probe contour.

In addition, the method of FIG. 9 comprises providing S3 an electrical connection on the probe body to the at least one probe tip, for example as a microstrip line or a coplanar line with a predetermined impedance, like 50 Ohms.

The method also comprises providing an electrical connector S4 for at least one of the probe tips on the probe body and electrically coupling the electrical connector to the respective electrical connection, and providing a resistor S5 in the electrical connection of the at least one probe tip with a predetermined resistance value. The resistance value may be between 50 kOhms and 500 kOhms.

The resistor may be provided as a surface-mounted device or may be provided as a printed resistor, especially a polymer thick film printed resistor.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

LIST OF REFERENCE SIGNS

| | |
|---|---|
| 100, 400, 500 | measurement probe |
| 101, 201, 401, 501 | carrier substrate |
| 102, 202, 302, 402, 405, 502, 505 | probe tip |
| 103, 403, 406, 503, 506 | probe body |
| 104, 404, 407, 504, 507 | metallization layer |
| 410, 413, 510, 513 | electrical connection |
| 411, 414, 511, 514 | resistor |
| 412, 415, 512, 515 | electrical connector |
| SE1, SE2, SE3, SE4, SES, SE6 | section |

The invention claimed is:

1. A method, comprising:
cutting a carrier substrate to form a probe contour, the probe contour comprising at least one probe tip and a probe body, wherein the carrier substrate comprises a conductive layer which is formed on the carrier substrate;
forming the at least one probe tip by cutting the carrier substrate to provide a respective protrusion in a first plane that includes a plane of extension of the carrier substrate, wherein forming the at least one probe tip comprises at least one of laser cutting or milling a height profile comprising more than one height steps of the respective protrusion in the carrier substrate in a second plane that is orthogonal to the first plane; and
metallizing a surface of the at least one probe tip of the probe contour such that a resulting metallization layer completely covers the probe tip, wherein the resulting metallization layer directly contacts an opposite side of the conductive layer of the probe tip.

2. The method according to claim 1, wherein forming the at least one probe tip comprises at least one of laser cutting or milling an outer circumference of the respective protrusion.

3. The method according to claim 1, wherein the carrier substrate comprises a single-layer or multi-layer metallized printed circuit board carrier substrate.

4. The method according to claim 1, wherein the metallizing comprises metallizing the surface of the at least one probe tip with the metallization layer comprising a nickel palladium gold alloy.

5. The method according to claim 1, wherein the metallizing comprises coating the surface of the at least one probe tip with the metallization layer comprising a thickness of 10 μm to 50 μm.

6. The method according to claim 1, further comprising providing an electrical connection on the probe body to the at least one probe tip.

7. The method according to claim 6, wherein the electrical connection comprises a microstrip line or a coplanar line with a predetermined impedance.

8. The method according to claim 6, further comprising providing an electrical connector for the at least one probe tip on the probe body and electrically coupling the electrical connector to the electrical connection.

9. The method according to claim 6, further comprising providing in the electrical connection of the at least one probe tip or between the electrical connection and the at least one probe tip a resistor with a predetermined resistance value between 50 kOhms and 500 kOhms.

10. The method according to claim 9, wherein the resistor is provided as a surface-mounted device.

11. The method according to claim 10, wherein the resistor is provided at a distance of 0.1 mm to 1.5 mm from a contacting end of the at least one probe tip.

12. The method according to claim 9, wherein the resistor is provided as a printed resistor.

13. The method according to claim 1, wherein the respective protrusion is formed by using at least one of laser cutting or milling to form a plurality of surfaces at different heights within the height profile.

14. A measurement probe comprising:
- a carrier substrate in a form of a probe contour of the measurement probe, the probe contour comprising at least one probe tip and a probe body; and
- a metallization layer on a surface of the at least one probe tip;
- wherein the at least one probe tip comprises a respective protrusion in a first plane that includes a plane of extension of the carrier substrate,
- wherein the metallization layer completely covers the probe tip,
- wherein a conductive layer is formed on a surface of the carrier substrate,
- wherein the metallization layer directly contacts an opposite side of the conductive layer of the probe tip; and
- wherein the respective protrusion is formed by at least one of laser cutting or milling a height profile comprising ono more than one height steps of the respective protrusion in the carrier substrate in a second plane that is orthogonal to the first plane.

15. The measurement probe according to claim 14, wherein the carrier substrate comprises a single-layer or multi-layer metallized printed circuit board carrier substrate.

16. The measurement probe according to claim 14, wherein the metallization layer comprises at least one of a nickel palladium gold alloy or the metallization layer comprises a thickness of 10 μm to 50 μm.

17. The measurement probe according to claim 14, further comprising an electrical connection on the probe body to the at least one probe tip.

18. The measurement probe according to claim 17, wherein the electrical connection comprises a microstrip line or a coplanar line with a predetermined impedance.

19. The measurement probe according to claim 17, further comprising an electrical connector for the at least one probe tip on the probe body electrically coupled to the electrical connection.

20. The measurement probe according to claim 17, further comprising in the electrical connection of the at least one probe tip or between the electrical connection and the at least one probe tip a resistor with a predetermined resistance value with a resistance value between 50 kOhms and 500 kOhms.

21. The measurement probe according to claim 20, wherein the resistor comprises a surface-mounted device provided at a distance of 0.1 mm to 1.5 mm from a contacting end of the at least one probe tip.

22. The measurement probe according to claim 20, wherein the resistor comprises a printed resistor.

23. A method, comprising:
- cutting a carrier substrate to form a probe contour, the probe contour comprising at least one probe tip and a probe body, wherein the carrier substrate comprises a conductive layer which is formed on the carrier substrate;
- forming the at least one probe tip by cutting the carrier substrate to provide a respective protrusion in a predefined first plane that includes a plane of extension of the carrier substrate, wherein forming the at least one probe tip comprises at least one of laser cutting or milling a height profile comprising more than one height steps of the respective protrusion in the carrier substrate in a second plane that is orthogonal to the first plane;
- metallizing a surface of the at least one probe tip of the probe contour such that a resulting metallization layer completely covers the probe tip, wherein the resulting metallization layer directly contacts an opposite side of the conductive layer of the probe tom; and
- providing in an electrical connection of the at least one probe tip or between the electrical connection and the at least one probe tip a resistor with a predetermined resistance value between 50 kOhms and 500 kOhms, wherein the resistor is provided at a distance of 0.1 mm to 1.5 mm from a contacting end or edge of the respective probe tip.

* * * * *